United States Patent [19]
Verger et al.

[11] Patent Number: 6,043,495
[45] Date of Patent: Mar. 28, 2000

[54] IONIZING RADIATION DETECTION APPARATUS USING HIGH-RESISTIVITY SEMICONDUCTOR

[75] Inventors: Loïck Verger, Gremoble; Murali Rosaz, Paris; Jacques Rustique, Seyssinet; Gérard Sanchez, Grenoble, all of France

[73] Assignee: Commissariat a l'Energie Atomique, France

[21] Appl. No.: 08/989,515

[22] Filed: Dec. 12, 1997

[30] Foreign Application Priority Data

Dec. 24, 1996 [FR] France .................................. 96 15940

[51] Int. Cl.⁷ ....................................................... G01T 1/24
[52] U.S. Cl. .................. 250/370.01; 250/370.13
[58] Field of Search ............................ 250/370.13, 370.01

[56] References Cited

U.S. PATENT DOCUMENTS 5,391,882  2/1995  Rhiger .
5,627,377  5/1997  Hamilton, Jr. et al. ........... 250/370.13

FOREIGN PATENT DOCUMENTS 0777 277    6/1997   European Pat. Off. .
2110877     6/1983   United Kingdom .
WO 9604572  2/1996   WIPO .

OTHER PUBLICATIONS

P. Siffert, Cadmium Telluride and Related Materials As X– and Gamma–Ray Detectors: A Review of Recent Progress, SPIE, 1994, vol., 2305, 98–109.

P. N. Luke, Single–Polarity Charge Sensing in Ionization Detectors Using Coplanar Electrodes, Appl, Phys, Lett. Nov. 28, 1994, 2884–2886.

Primary Examiner—Constantine Hannaher
Assistant Examiner—Andrew Israel
Attorney, Agent, or Firm—Burns, Doane, Swecker & Mathis LLP

[57] ABSTRACT

The present invention relates to a low- and high-energy ionizing radiation detection apparatus composed of a semiconductor material provided with a cathode, an anode and at least one grid to form a radiation detector with a very high energy resolution rate that operates at ambient temperature.

7 Claims, 2 Drawing Sheets

IONIZING RADIATION DETECTION APPARATUS USING HIGH-RESISTIVITY SEMICONDUCTOR

DESCRIPTION

1. Field of the Invention

The present invention relates to an ionizing radiation detection apparatus based on a high-resistivity semiconductor with a high energy resolution level (20 to several MeV).

2. State of Prior Art

Many types of detectors have been designed for detecting X or γ radiation. Over the last three decades the use of semiconductor-based solid detectors has been the chief advance in techniques for detecting X or γ radiation; most of these apparatuses have been gas or scintillation detectors.

Semiconductor-based detectors directly convert the X or γ radiation in the material into energy without going through intermediate steps such as emitting visible photons in the case of scintillators. It is thus possible to eliminate the sort of coupling problems that result in loss of efficiency. The energy needed to produce an electron-hole pair in a semiconductor is considerably less than in a gas or scintillation detector (approximately 4 eV in semiconductors compared with 30 eV in gas and 300 eV in photomultiplying scintillator systems). Consequently the number of free charges created per photon detected is higher, making it possible to obtain better energy resolution with low noise. Moreover their high atomic number and great density make it possible to use considerably lower detection volumes than those required by gas or scintillation detectors while retaining the same quantum efficiency of detection (see reference [1] at end of Description).

All these advantages have made it possible to use semiconductor detectors in the following three fields (see reference [2]:

nuclear detection in which the aim is to measure the energy deposited by a γ photon emitted by a source of nuclear radiation, detection of X radiation in which the aim is to produce a radiological image of an object irradiated by a generator of X rays, scientific instrumentation wherever there is a need to detect short X radiation pulses and measure their development over time and their intensity.

The use of semiconductor materials as detectors of X or γ radiation involves depositing two electrical contacts on the surface of the material with terminals to which a polarizing voltage is applied. The charge carriers, i.e. the electron-hole pairs created by the interaction of the γ photon with the material, separate under the effect of the electrical field, the electrons migrating towards the positive electrode and the holes towards the negative electrode. The ability of these charge carriers to migrate towards the electrodes without being trapped by defects present in the semiconductor determine the energy resolution of the 30 spectrum (in γ detection) or the signal (in X detection) measured. This ability, which is also referred to as "transport properties of charge carriers" is measured as the mobility and lifetime of the electrons and holes (see article reference [3]).

The performances of present-day γ detectors are limited by the presence of inherent defects in semiconductor which, by trapping charge carriers during migration to the electrodes, reduce their lifetime and thereby diminish the energy resolution of detectors. The influence of these defects on the trapping of charge carriers increases with the thickness of the detector and the consequently higher the rate of energy required (>100 keV). These intrinsic defects appear systematically during the crystal-growth phase of semiconductor material production. There is considerable literature available on these defects, demonstrating that no crystal-growth techniques for any high resistivity semiconductor operating at ambient temperature is capable of eliminating them (see article reference [4]).

There are several ways of compensating for the trapping of charge carriers during migration (see reference [1]):

Using diode structures which, by reducing dark current by a factor of approximately 10, make it possible to apply a powerful electric field, thereby limiting trapping of free carriers. However, improvements in detector performance have only been seen at low thicknesses. Moreover, some semiconductors like CdTe have a polarization effect (reduction of the signal over time) which makes diode structures unusable. Even though this effect can be overcome by subjecting CdTe diodes to low temperatures (see reference [5]), implementation is fairly clumsy.

Selecting the photon interactions with the material for which carrier trapping is limited. This means selecting interactions close to the irradiated electrode for which the electron signal is predominant. Since the transport properties of electrons are considerably better than those of holes, very good energy resolution can be obtained. Unfortunately this is to the detriment of the quantum detection efficiency of the detector since this selection eliminates interactions occurring remote from the irradiated electrode. The useful thickness of the detector is therefore electronically limited.

Compensating for the poor transport properties of the holes by measuring the relation that exists between the amplitude of the integrated signal of each interaction and its rise time. This new method shows that this relation is linear for certain CdTe detectors, making it possible to correct poorly-collected "hits" from low amplitudes and long rise times (see reference [6]). At the present time this appears to be the only method capable of producing CdTe-based γ detectors with good energy resolution and quantum detection efficiency. Unfortunately it will not operate with all types of CdTe material; some crystal-growing methods producing no correlation between amplitude and rise time and irrespective of the type of CdTe detector, thickness must be limited to 2 nm since above this measurement amplitude-time correction cannot be corrected. The detector also needs to have certain physical properties (good hole-transfer properties).

Using hemispherical detectors, but these are difficult to implement.

The aim of the present invention is to provide a new detection structure based on a high-resistivity semiconductor that makes it possible to produce a γ detector with a very high energy resolution that operates at ambient temperature. It is assumed that the said structure overcomes the poor transport properties of the charge carriers in thick detectors.

The problem of efficient collection of charge carriers is not new and was already known in gas detectors. One of the solutions was the introduction of the Frisch strip (see reference [7]), the principle of which is to insert a transparent grid between the two electrodes. This grid has a potential intermediate between that of the anode and that of the cathode. The useful signal of the detector is measured between the potential of the anode and the potential of the Frisch strip disposed close to the anode. Following irradiation of the cathode with γ radiation, charge carriers are created between the cathode and the Frisch strip; electrons migrate easily towards the Frisch strip while the ions have difficulty migrating towards the cathode. During migration of the charge carriers no signal is measured at the anode since the potential of the Frisch strip constitutes an electrostatic screen. A signal corresponding to migration of electrons between the Frisch strip and the anode is only measured when electrons pass through the grid. Because the transport properties of the electrons are excellent no electrons are trapped during migration between their interaction site and the Frisch strip. Any trapping may be corrected by adding a variable gain to the anode charge preamplifier. Consequently the signal measured at the anode does not depend on the interaction site of the photon between the cathode and the Frisch strip. The ion signal component is thereby eliminated.

In order to increase the carrier collection efficiency, semiconductor detectors in the prior art comprise interdigitized comb electrodes to produce a Frisch strip effect. These apparatuses required two preamplifiers per pixel, thereby complicating the electronic design of a gamma imager and causing other technical problems such as resistivity between electrodes on the same surface.

Examples of embodiments of this type of semiconductor structure may include interdigitized combs known as "Coplanar Frisch strip Structures" (CFS), the names "common mode" and "strip mode" being used to refer to the acquisition electronics.

P. N. Luke (see reference [8]) provides the construction of a structure similar to Frisch strips for CdTe semiconductors. This consists of depositing standard contacts by gold or platinum evaporation on the entire surface for the cathode (irradiated electrode) and in strip form for the anode. One half of these strips are interconnected with a potential weaker than that of the other half, which are also interconnected. Each of these two potentials is connected to a load preamplifier in which the charge due to the migration of the electrons to the anode is integrated. This charge is identical for the two preamplifiers until the electrons reach the anode. In contrast, due to the difference in the two potentials of the anode, the charge integrated on each preamplifier is different when the electrons are very close to the anode. This geometrical peculiarity makes it possible, by using the difference in the two signals integrated on the two preamplifiers, to make this difference (useful signal) independent of the photon interaction site since the difference only appears when the electrons are very close to the anode. Although fairly remarkable results can be obtained, this method has the drawback of requiring two preamplifiers per pixel. When constructing a γ imager composed of thousands of pixels, the electronics required are very clumsy. It is also sensitive to the surface state of the anode, i.e. its polishing quality, the sensitive area being close to the anode; it also causes technical problems due to the fact that the resistance between the combs must be high.

The purpose of the invention is therefore to produce this type of Frisch strip detecting structure suitable for semiconductors.

DISCLOSURE OF THE INVENTION

The invention relates to an ionizing radiation detection apparatus comprising a block of high-resistivity semiconductor material capable of detecting an electric signal obtained by the interaction of radiation striking the semiconductor material, provided with a cathode at a first potential and an anode at a second potential, characterized in that it includes at least one grid located between the cathode and the anode, said grid being polarized at a third potential greater than the first and slightly less than the second so that the signal generated between the grid and the anode is independent of the site at which the photon interacts with the semiconductor material and in that the Frisch strip thus constituted is formed of a single piece without requiring any specific contact geometry or depositing of diodes.

In a first alternative embodiment the metallic grid or grids are obtained by inserting semiconductors into the crucible before growing the crystals so that said grids are an integral part of the bar before the crystals are grown. The bar is then cut into detectors and standard contacts applied to either surface of the detector to produce true Frisch strips.

In a second alternative this grid is produced by forming a comb whose upper sections are at the second potential and the lower sections are at the third potential. A toothed structure is made in one of the surfaces of the block of semiconductor material. The lines of contact, polarized at the third potential, constitute an electrostatic screen with contact lines polarized at the second potential when the charges migrate from the cathode to the strip. The signal measured corresponds to the migration of the charges from the grid to the anode.

The invention may be applied to thick detectors (between two and ten millimeters) of α, β, γ and X radiation. In the case of X rays the photon flow rate should be slow enough for the detector to distinguish each photon.

The main application of the invention is to the field of nuclear detection but it can also be applied to X-ray detection and scientific instruments where less exacting detection requirements apply.

DETAILED DISCLOSURE OF AN EMBODIMENT

Figure 1A:
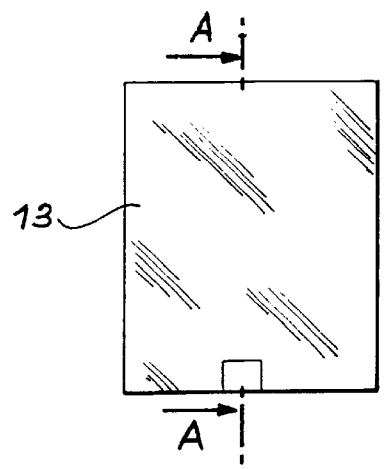
FIGS. 1A, 1B and 1C show an example of a radiation detection apparatus using a Frisch strip in a side view and in cross section at AA and BB (mesh) respectively.
Figure 1B:
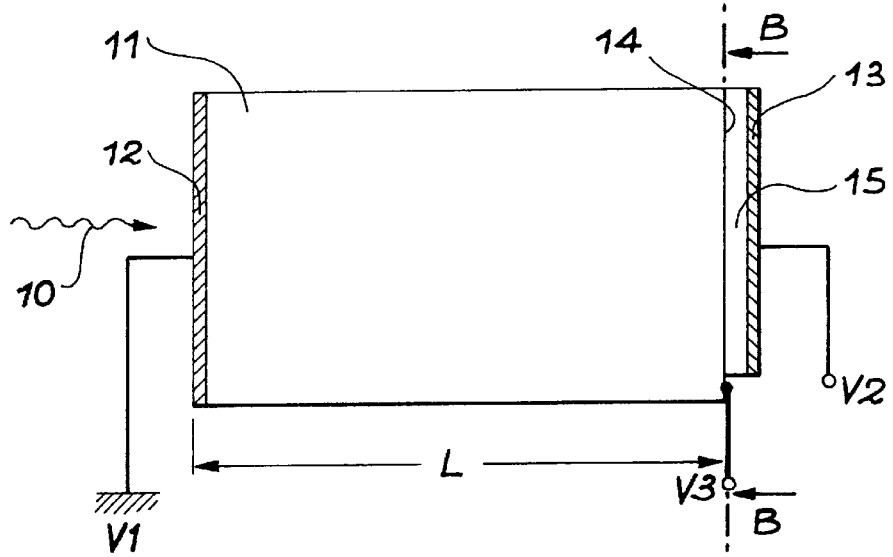
Figure 1C:
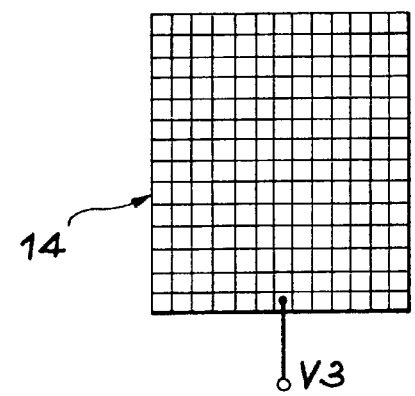

The ionizing radiation detection apparatus shown in FIG. 1 comprises a block of high-resistivity semiconductor material capable of detecting an electric signal obtained by the interaction of radiation 10 striking the semiconductor material 11. The apparatus which due to its described structure can be considered to be monolithic, is provided with a cathode 12 at a first potential V1, an anode 13 at a second potential V2, a grid 14 and a diode zone 15 located between the cathode 12 and the anode 13. Said grid 14 is polarized at a third potential V3 that is greater than V1 and slightly less than V2 so that the signal generated between the grid and the anode is independent of the site at which the photon interacts with the semiconductor material. Therefore V1<<V3<V2 where V3>0 and V2>0.

This technique can be applied to thick detectors (i.e. of width between 2 and 10 mm) of α, β, γ and X radiation. In the case of X rays the photon flow rate should be slow enough for the detector to distinguish each photon.

This apparatus makes it possible to produce a grid that is transparent to electrons and whose potential screens the signal measured at the anode and to deposit a diode sensitive to electrons on the resistive semiconductor material.

("Diode" is understood to mean a material that gives a signal when an electron enters its electrode (electron detector)).

For example, the semiconductor material may be chlorine-doped CdTe, although any other type of CdTe may be used, preferably oriented (111). This (111) orientation makes it possible to adapt a first surface of the block of semiconductor material (surface B or white surface revealed using lactic acid or deposition of a HgCdTe-based heterojunction). A metal contact (gold, platinum, silver, copper, etc.) is deposited on the entire surface to constitute the cathode 12. A second surface opposite the first is chemically stripped using, for example, brominated methanol. A lithographic stage is used to deposit grid 14 that has a mesh optimized to achieve a compromise between being transparent to electrons and creating a potential, but also the quality of the diode layer 15 to be deposited.

A compromise is needed when making the grid:
 if the mesh is fine, transparency is increased to the detriment of electrostatic screening (i.e. a signal resulting from electron migration may be detected),
 if the detector is too fine, the photons pass through without being converted to electron-hole pairs; when it is too thick, the electrons may be trapped and there is a loss in collecting efficiency.

This apparatus offers a compromise between good detection efficiency (a thick detector enabling the generation of an electron-hole pair for each photon received) and good energy resolution (good charge collection). It offers a semiconductor detector in which the Frisch strip effect is obtained not because of the geometrical structure of the electrodes but because of the geometrical structure of the detecting material itself.

It is important to stress that the screening effect and the useful detection zone are due to a geometrical effect associated with the detector and not with the electric contact. This makes better use of the Frisch strip effect and makes it possible to use a single preamplifier per detector.

Diode layer 15 is sensitive to electrons and therefore of limited thickness (a few tens of microns). This limited thickness encourages increased sensitivity. This layer may be a heterojunction (HgCdTe-n, HgCdTe-p, CdS, ZnS, etc.) or a junction (MBE, EJM, LPE deposits embedded in the resistive material) formed by the curvature of the strip related to differences in potential in the Fermi levels of the substrate (resistive CdTe) and the deposited layer. The very limited thickness required to detect electrons opens the way to many deposition possibilities. The technology used in solar collectors may be used to advantage. Anode 13 consists of the deposition of a contact suitable for its function on the entire surface of the diode. This produces a semiconductor-based detection structure with a Frisch strip capable of giving high energy-resolution performances while only using a single charge preamplifier per detection cell (pixel). The operating principle is the same as that of a gas detector fitted with a Frisch strip. The thickness of CdTe detectors may reach six to ten millimeters thereby giving high resolution spectrometry for high energy levels ($\approx$1 MeV).

In order to produce semiconductor detectors that give improved detection efficiency and energy resolution, many laboratories offer Frisch strips based on special contact geometries (semiconductor+special contact geometries) or on deposition of a diode on a grid previously deposited on the semiconductor (semiconductor+diodes). The originality of the present invention consists in producing a Frisch strip composed of a single piece, the semiconductor only, without using special contact geometries or deposition of diodes.

In a first embodiment the present invention consists of placing one or more metallic grids (made, for example, of silicon carbide) in the crucible before growing semiconductor crystals. Said grid, whose mesh is optimized to give a compromise between transparency and screening, is thus incorporated into the bar before growth (the grid must be suitable for use at high frequencies). Special techniques for cutting the bar into detectors and deposition using standard techniques of contacts on both surface of the detector thereby produces a true Frisch strip as shown in FIG. 1.

Figure 2:
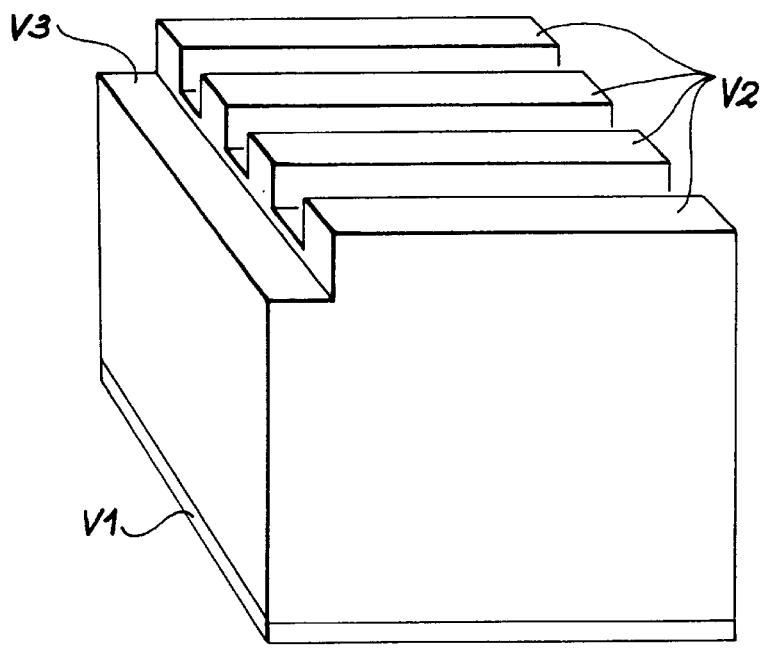
FIG. 2 shows the apparatus according to the invention, FIG. 3 compares the operation of the screen of the Frisch strip in common mode and strip mode.

A second alternative consists in producing a toothed structure on one of the surfaces of a CdTe detector as shown in FIG. 2. Grid 14 may be produced by forming a comb whose upper sections are at a second potential V2 and whose lower sections are at a third potential V3. The polarized contact lines at the first potential V1 constitute an electrostatic screen with contact lines polarized at the second potential V2 when the charges migrate from cathode 12 to grid 14. The signal measured corresponds to the migration of charges from grid 14 to anode 13. If the upper lines are shortcircuited the Frisch strip operates in common mode. For better performances a preamplifier per line may be used (strip mode).

The toothed structure may, for example, be formed using a cutting machine with a diamond saw.

The principle of the Frisch strip used in gas detectors and applied to the semiconductor-based detector of the invention gives higher performance characteristics, both in terms of detection efficiency and energy resolution, the higher the screening effect and the larger the useful electron detection zone:
 the strip structure uses electrode geometries to produce the screening effect and the useful detection zone. This zone is dependent on the pitch and bandwidth of the comb which, given the technical difficulties of producing a comb, limits the possibilities. Moreover, a preamplifier must be provided for each band in order to observe the screening effect. For example, eight to sixteen preamplifiers are required per 4×4×5 mm$^3$ detector (one pixel in a matrix system),
 the interdigitized comb structure also has an electron-sensitive zone dependent on the pitch and bandwidth. Moreover, the useful signal corresponds to the subtraction of the signal associated with each comb. Two preamplifiers per detector are therefore required and the resulting signal (subtraction of the two signals measured by the preamplifiers) remains weak with a poor signal-to-noise ratio.

Figure 3:
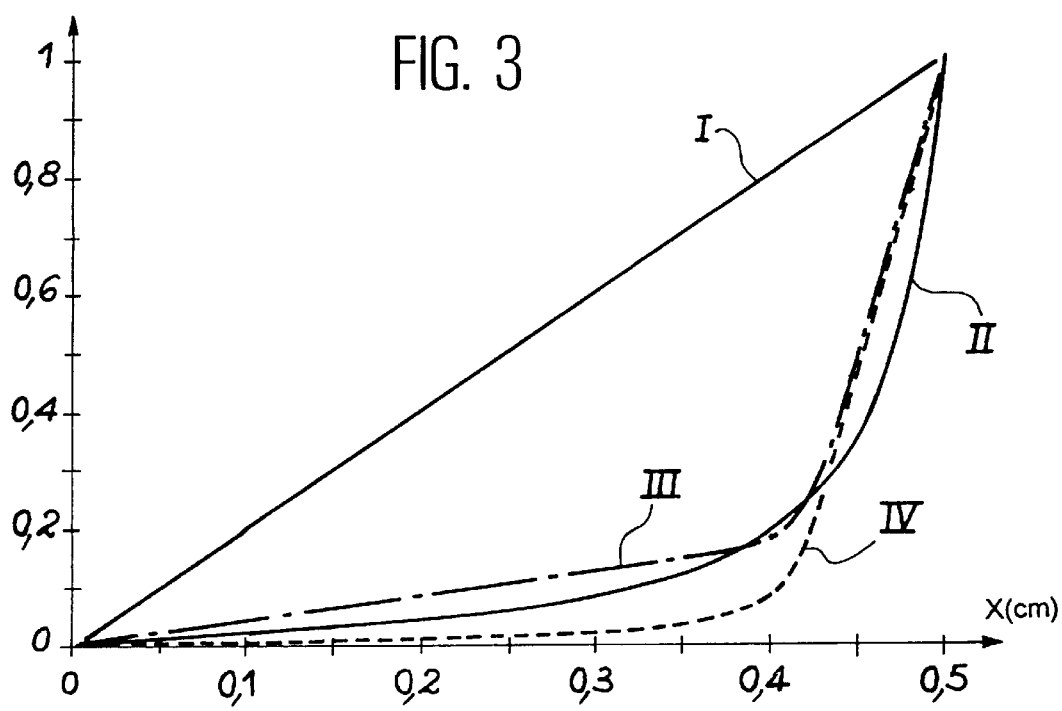

FIG. 3 shows a comparison between the function of the screen and that of the toothed Frisch strip of a CdTe detector in plane mode (I), SF strip mode (II), CFDC common mode (III) and GFDS strip mode (IV). The detector has the following measurements:
Thickness=5 mm
Geometry=5*5 mm$^2$
Tooth height=0.8 mm
Wc (width of collector electrode (V2))=0.56 mm
Wnc (width of non-collector electrode (V3))=0.04 mm
Pixel width=0.56 mm
Interpixel distance=0.04 mm

REFERENCES

[1] Article entitled "Cadmium telluride and related materials as X-and gamma-ray detectors: a review of recent progress" by P. Siffert (SPIE, volume 2305, pages 98 to 109)

[2] Article entitled "CdTe in photoconductive applications. Fast detector for metrology and X-ray imaging" by Marc Cuzin (Nuclear Instruments and Methods in Physics Research, A 322, 1992, pages 341–351)

[3] Article entitled "Transport Properties of CdTe" by C. Canali, M. Martini, G. Ottaviani and K. R. Zanio (Physical Review B, volume 4, number 2, Jul. 15 1971, pages 422 to 431)

[4] Article entitled "Structural defects in high resistivity cadmium telluride" by N. Samimi, B. Biglari, M Hage-Ali, J. M. Koebel and P. Siffert (Nuclear Instruments and Methods in Physics Research, A283, 1989, pages 243 to 248).

[5] Article entitled "Cadmium telluride detectors with thermoelectric cooling" by A. Kh. Khusainov (Nuclear Instruments and Methods in Physics Research, A322, 1992, pages 335 to 340).

[6] Article entitled "Pulse processing for planar cadmium telluride detectors" by M. Richter, M. Hage-Ali, Z. T. Kurnicki and P Siffert (Material Research Society, Symposium Proceedings, volume 302, 1993, pages 195 to 204).

[7] Article by 0. Frisch (British Atomic Energy Report BR-49-1944).

[8] Article entitled "Single-polarity charge sensing in ionization detectors using coplanar electrodes" by P. N. Luke (Applied Physic letter, No. 65, 1974 pages 2884 et seq.).

We claim:

1. Ionizing radiation detection apparatus comprising a block of high-resistivity semiconductor material capable of detecting an electric signal obtained by the interaction of radiation (10) striking the semiconductor material (11), provided with a cathode (12) at a first potential (V1) and an anode (13) at a second potential (V2), characterized in that the apparatus is monolithic and includes at least one grid (14) located between the cathode (12) and the anode (13) to thus constitute a Frisch strip, said grid being polarized at a third potential (V3) greater than the first (V1) and slightly less than the second (V2) so that the signal generated between the grid and the anode is independent of the site at which the photon interacts with semiconductor material, and in that the Frisch strip thus constituted is formed of a single piece in the semiconductor material block without requiring any specific contact geometries or the deposition of diodes.

2. Apparatus of claim 1 wherein the metallic grid or grids are obtained by inserting semiconductors into a crucible before semiconductor crystal growth so that said grids are an integral part of the semiconductor block, the block then being cut into detectors and standard contacts applied to each surface of the detector to produce true Frisch strips.

3. Apparatus of claim 1 wherein the grid (14) is produced by forming a comb whose upper sections are at the second potential (V2) and the lower sections are at the third potential (V3).

4. Apparatus of claim 3 wherein a toothed structure is made in one of the surfaces of the block of semiconductor material, the lines of contact, polarized at the first potential (V1), constituting an electrostatic screen with contact lines polarized at the second potential (V2) when the charges migrate from the cathode (12) to the Frisch strip, the signal measured corresponding to the migration of the charges from the Frisch strip to the anode (13).

5. Apparatus of claim 1 that may be applied to $\alpha, \beta, \gamma$ and X radiation detectors of thicknesses of between two and ten millimeters.

6. Apparatus of claim 5 wherein, in the case of X rays, the photon flow rate is slow enough for the detector to distinguish each photon.

7. Apparatus of claim 4, that may be applied to $\alpha, \beta, \gamma$ and X radiation detectors of thicknesses of between two and ten millimeters.

* * * * *